United States Patent
Lopatin et al.

(10) Patent No.: US 6,972,254 B1
(45) Date of Patent: Dec. 6, 2005

(54) MANUFACTURING A CONFORMAL ATOMIC LINER LAYER IN AN INTEGRATED CIRCUIT INTERCONNECT

(75) Inventors: Sergey D. Lopatin, Santa Clara, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/327,428

(22) Filed: Dec. 20, 2002

Related U.S. Application Data

(62) Division of application No. 09/872,328, filed on Jun. 1, 2001, now Pat. No. 6,528,884.

(51) Int. Cl.[7] .......................................... H01L 21/4763
(52) U.S. Cl. ....................... 438/637; 438/627; 438/656
(58) Field of Search ............................... 438/627, 637, 438/656

(56) References Cited

U.S. PATENT DOCUMENTS

| | | | | |
|---|---|---|---|---|
| 5,882,738 A | * | 3/1999 | Blish et al. | 427/526 |
| 5,893,752 A | * | 4/1999 | Zhang et al. | 438/687 |
| 5,972,179 A | * | 10/1999 | Chittipeddi et al. | 204/192.17 |
| 6,303,490 B1 | * | 10/2001 | Jeng | 438/627 |
| 6,346,477 B1 | * | 2/2002 | Kaloyeros et al. | 438/680 |
| 6,391,769 B1 | * | 5/2002 | Lee et al. | 438/643 |
| 6,482,733 B2 | * | 11/2002 | Raaijmakers et al. | 438/633 |
| 6,664,192 B2 | * | 12/2003 | Satta et al. | 438/704 |
| 2001/0049181 A1 | * | 12/2001 | Rathi et al. | 438/471 |

* cited by examiner

*Primary Examiner*—Howard Weiss
(74) *Attorney, Agent, or Firm*—Mikio Ishimaru

(57) ABSTRACT

A manufacturing method for an integrated circuit has a substrate with a semiconductor device thereon. A channel dielectric layer is deposited over the device and has an opening provided therein. A reducing process is performed in order to reduce the oxidation on the conductor and a conformal atomic liner is deposited in an atomic layer thickness to line the opening in the channel dielectric layer. A barrier layer is deposited over the conformal atomic liner and a seed layer is deposited over the barrier layer. A conductor core layer is deposited on the seed layer, filling the opening over the barrier layer and connecting to the semiconductor device.

14 Claims, 2 Drawing Sheets

MANUFACTURING A CONFORMAL ATOMIC LINER LAYER IN AN INTEGRATED CIRCUIT INTERCONNECT

CROSS-REFERENCE TO RELATED APPLICATIONS

This is a divisional of application Ser. No. 09/872,328, filed on Jun. 1, 2001, now U.S. Pat. No. 6,528,884.

TECHNICAL FIELD

The present invention relates generally to semiconductor technology and more particularly to a conformal atomic liner in integrated circuit interconnects.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two interconnect channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. An abrasiveless chemical is used for the chemical-mechanical polishing process in order to prevent abrasives from being left in the channel. When a layer is placed over the first channels as a final layer, it is called a "capping" layer and a "single" damascene process is completed. When the layer is processed further for placement of additional channels over it, the layer is a via stop layer.

The via formation step of the dual damascene process starts with the deposition of a thin via stop layer over the first channels and the first channel dielectric layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "capping" layer and the "dual" damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

A major problem with using copper in the conductor core is that copper tends to migrate into the dielectric layer in a process known as diffusion. The migration of copper atoms can lead to electrical short circuits, rendering the circuit unusable. Barrier layers deposited by self-ionized plasma (SIP) deposition have traditionally had high barrier resistance to limit the diffusion of copper atoms, but as the dimensions of semiconductor devices shrink in the quest to improve chip performance, the proportional scaling of barrier layer dimensions in vias leads to extremely thin (10–20 angstroms) via sidewalls.

In addition, the size reductions have caused the channels to be closer together which requires the use of low dielectric constant (low-k) dielectric materials having dielectric constants under 3.9. These dielectric materials are porous and, where the SIP barrier depositions were formerly conformal to the conventional dielectric constant dielectric materials, the SIP barrier layers are no longer conformal to these materials.

Both the thinness of the barrier layer, and its now non-conformal characteristic, has led to its ineffectiveness as a diffusion barrier and also to the formation of voids in the associated seed layer and conductor core leading to reductions in electromigration (EM) resistance.

Diffusion relates to the movement of copper atoms from the conductor core into the dielectric layer, causing short circuits and EM relates to the movement of copper atoms under influence of current, particularly at the interface between layers or areas of poor adhesion, which form voids that can lead to an open circuit in the via.

For current barrier layers, EM problems occur at the sidewalls, at via corners, and at the capping layer. Also, there is a degassing problem which occurs in local areas of the interconnect due to induced temperature increase because of current crowding where the current makes sharp turns entering or exiting from vias.

DISCLOSURE OF THE INVENTION

The present invention provides a manufacturing method, for an integrated circuit including a substrate with a device provided thereon. A semiconductor device is formed on a semiconductor substrate with a conductor connected thereto. A channel dielectric layer is deposited over the device and has an opening provided therein. A reducing process is performed in order to reduce the oxidation on the conductor and a conformal atomic liner is deposited in an atomic layer thickness to line the opening in the channel dielectric layer. A barrier layer is deposited over the conformal atomic liner and a seed layer is deposited over the barrier layer. A conductor core layer is deposited on the seed layer, filling the opening over the barrier layer and connecting to the semiconductor device.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
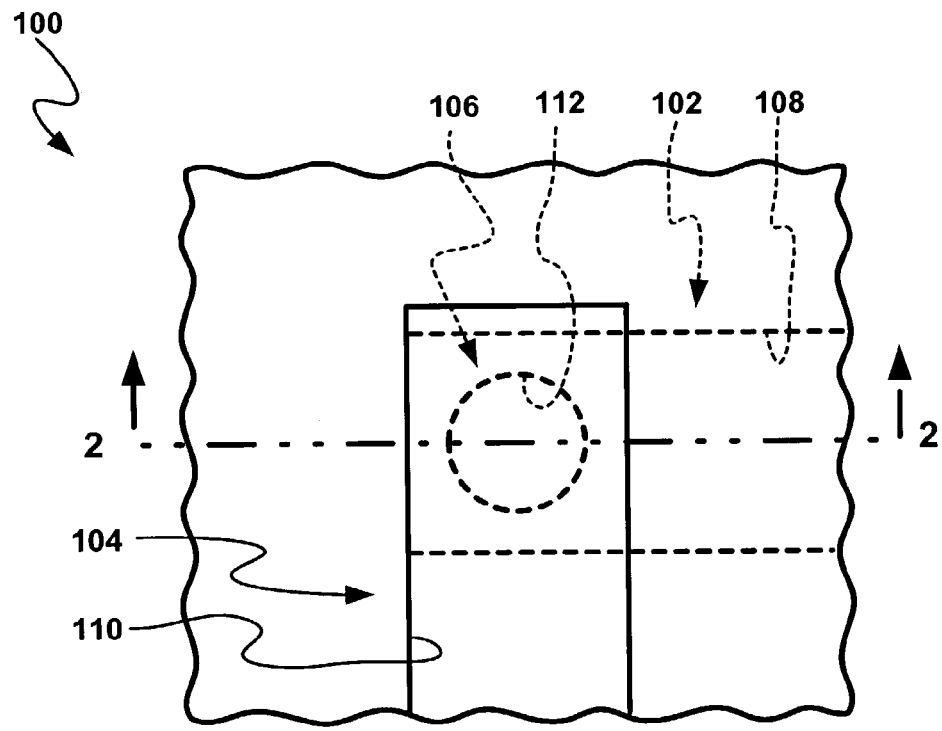
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
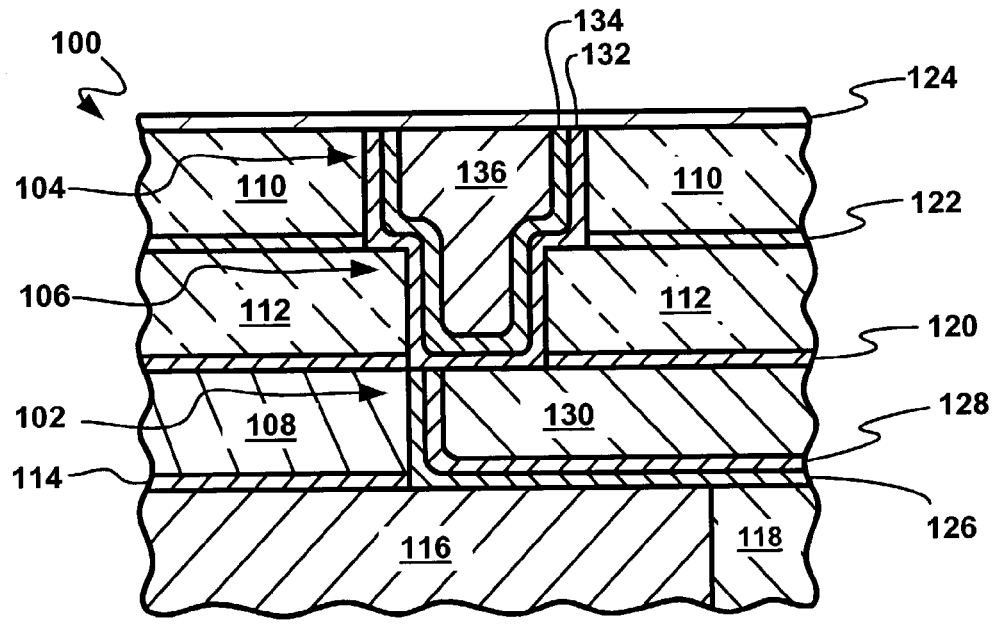
FIG. 2 (PRIOR ART) is a cross-section of FIG. 1 (PRIOR ART) along line 2—2 wherein electromigration is a significant problem.

Referring now to FIG. 2 (PRIOR ART), therein is shown a cross-section of FIG. 1 (PRIOR ART) along line 2—2. A portion of a first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same semiconductor material as the conductor cores 130 and 136 and become part of the respective conductor cores 130 and 136 after the deposition.

The migration of copper atoms can lead to electrical short circuits, rendering the circuit unusable. The barrier layers 126 and 132 have traditionally had high barrier resistance to limit the diffusion of copper atoms, but as the dimensions of semiconductor devices have shrunk, the proportional scaling of barrier layer dimensions in the via 106 leads to an extremely thin (10–20 angstroms) via sidewall.

In addition, the size reductions have caused the channels 102 and 104 to be closer together which requires the use of low dielectric constant dielectric materials having dielectric constants under 3.9 to be used in the first channel dielectric layer 108, the via dielectric layer 112, and the second channel dielectric layer 110. These dielectric materials are porous and, where the barrier depositions were formerly conformal to the conventional dielectric constant dielectric materials, the barrier layers 126 and 132 are no longer conformal to these materials.

Both the thinness of the barrier layers 126 and 132, and their now non-conformal characteristic, have led to their ineffectiveness as diffusion barriers and also to the formation of voids in the seed layers 128 and 134 and the conductor cores 130 and 136 leading to reductions in electromigration (EM) resistance.

For the barrier layers 126 and 132, EM problems occur at the sidewalls, at via corners, and at the capping layer. Also, there is a degassing problem which occurs in local areas of the interconnect due to induced temperature increase because of current crowding where the current makes sharp turns entering or exiting from vias.

Figure 3:
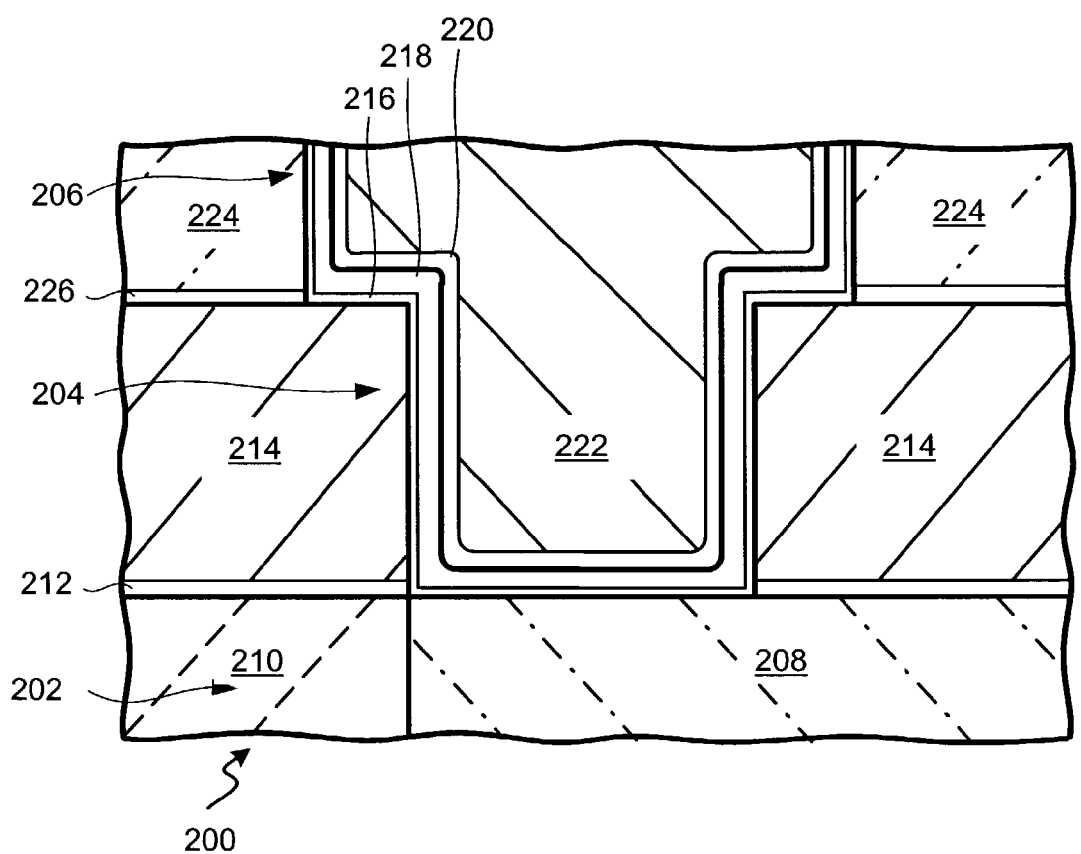
FIG. 3 shows a close-up cross-section similar to FIG. 2 (PRIOR ART) including a conformal atomic liner according to the present invention.

Referring now to FIG. 3, therein is shown a step in a dual damascene process on a semiconductor wafer 200. An opening is made in a first channel dielectric layer 210 and a first conductor core 208 fills the opening to form a first channel 202. The first channel 202 is electrically connected to a second channel 206 by a via 204. The via 204 and second channel 206 are formed by first depositing a via stop layer 212, typically of silicon nitride (SiN), and depositing and patterning a via dielectric layer 214 on the via stop layer 212. A channel stop layer 226 is deposited and patterned and a second channel dielectric layer 224 is deposited and opening is formed in one step to form the opening for the second channel 206 and the via 204. The first channel dielectric layer 210, the via dielectric layer 214, and the second channel dielectric layer 224 are of a low dielectric constant dielectric material having a dielectric constant under 3.9.

A reducing process, such as an $NH_3$ plasma process, is performed to the reduce the oxidation on the first conductor core 208 formed during the manufacturing process, which includes chemical mechanical polishing and deposition of the via stop layer 212. For copper conductor cores, the oxidation is copper oxide. Oxides are poor conductors and increase the resistance to the flow of electricity in the via 204 as well as providing poor adhesion for subsequent deposition of materials.

The reducing process also improves the adhesion of the subsequent deposition of a conformal atomic liner 216. The conformal atomic liner 216 is conformally deposited over the via dielectric layer 214 and second channel dielectric layer 224 to be of a "atomic" layer thickness, which is a thickness from 30 to 70 Å, and which is deposited to such thinness using an atomic layer deposition (ALD) or atomic layer chemical vapor deposition (ALCVD) process. The ALD process is a low temperature reaction (150–350° C.) that uses a barrier material precursor with hydrogen ($H_2$) and/or nitrogen ($N_2$) gas.

A barrier layer 218 of tantalum is deposited on the conformal atomic liner 216 by a process such as self-ionized plasma (SIP) deposition and a seed layer 220 is deposited using the same process to be an electrode for the electroplating of the conductor core 222 of the second channel 206 and the via 204. By way of comparison, the barrier layer 218 is deposited to a thickness of 10 to 250 angstroms.

Despite its thinness, it has been unexpectedly found that the combination of the conformal atomic liner 216 with the barrier layer 218 eliminates diffusion and EM problems at a combined thickness of the less than the barrier layer 218 alone.

In an alternative embodiment, the conformal atomic liner 216 is enhanced after the atomic layer deposition by a pre-sputtering process of the conformal atomic liner 216 with additional material to an additional thickness of 20–50 angstroms to insure complete coverage of the inside of the via 204.

In another alternate embodiment, a 1.5 nm thick composite layer of barrier material and seed layer material can serve as a catalytic layer for electroless copper alloy seed deposition.

While a PVD-type copper/tantalum interface provides the best EM performance, the scaling via dimensions with increasing aspect ratio leads to a situation when the thickness of a non-conformal SIP tantalum layer on sidewalls approaches 10–20 angstroms and cannot serve as a barrier layer for copper diffusion that creates copper diffusion pathways during electromigration effect. ALD tungsten liner provides a conformal atomic liner on the sidewalls and with introduction of an amorphous composite layer of tungsten with N, Si and/or C it provides barrier properties against copper diffusion. This liner reduces copper diffusion during EM.

Further, to reduce via resistance, reducing thickness of high resistance barriers at the via bottom is highly desired. It can be performed by back sputtering tungsten from the bottom to the via sidewall prior to SIP tantalum layer deposition. The SIP tantalum layer deposition is also adjusted to form the thinnest layer at the bottom.

In another embodiment, all the tungsten conformal atomic liner is removed from the bottom and the interconnect has only a thin tantalum barrier layer.

In another embodiment, all tungsten and all tantalum are removed from the via bottom by combination of sputtering and plasma treatment.

Further, lower temperatures of ALD tungsten composite layer deposition (150–250° C.) can be achieved when the low-k dielectric material surface is treated with $SiH_4$ prior to tungsten deposition. $SiH_4$ treatment forms a surface silicon-doped layer or layer with impurities of silicon on the low-k dielectric surface. These silicon impurities serve as nucleation centers for low temperature ALD or ALCVD of the tungsten composite layer.

In a preferred embodiment, a copper interconnect with an integrated barrier is formed using a SIP tantalum diffusion-barrier and an ALD conformal tungsten composite conformal atomic liner by following steps:

vacuum anneal to de-gas low-k dielectric; $NH_3$ plasma treatment to remove Copper oxide from via bottom;

$SiH_4$ treatment to form silicon impurities at low-k surface;

Low temperature ALD tungsten composite conformal atomic liner deposition on silicon nuclei in a first cycle for tungsten composite conformal atomic liner nucleation; repetition of tungsten layers on tungsten/low-k by cycled low temperature ALD;

(optional) $NH_3$ plasma treatment to amorphize the tungsten composite conformal atomic liner (this can be performed by plasma treatments in environments of $NH_3$, $H_2$, $N_2$, $N_2H_2$, or their combinations);

Sputtering of the tungsten conformal atomic liner from the via bottom to the sidewalls;

SIP tantalum diffusion-barrier and copper seed deposition on the tungsten composite conformal atomic liner;

copper electroplating to fill damascene features electropolishing (and/or CMP) to remove conductive layers from the surface.

In various embodiments, the conformal atomic liner and the barrier layers are of materials such as tantalum (Ta), titanium (Ti), tungsten (W), alloys thereof, and compounds thereof. The seed layers (where used) are of materials such as copper (Cu), gold (Au), silver (Ag), compounds thereof and combinations thereof with one or more of the above elements. The conductor cores with or without seed layers are of materials such as copper, aluminum (Al), gold, silver, compounds thereof, and combinations thereof. The low dielectric constant dielectric materials are materials such as fluorinated tetraethoxysilane (FTEOS), hydrogen silsesquioxane (HSQ), benzocyclobutene (BCB), etc. with dielectric constants below 3.9. The stop layers and capping layers are of materials such as silicon nitride ($Si_xN_x$) or silicon oxynitride (SiON).

While the invention has been described in conjunction with a specific best mode, it is to be understood that many alternatives, modifications, and variations, will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising;

providing a substrate having a semiconductor device thereon and an oxidizable conductor connected thereto;

forming a dielectric layer over the substrate and the oxidizable conductor;

forming an opening in the dielectric layer exposing the oxidizable conductor;

applying a reducing process to the opening in the dielectric layer to reduce the oxidizable conductor;

depositing a conformal atomic liner over the dielectric layer and lining the opening to an atomic layer thickness;

depositing a barrier layer over the conformal atomic liner;

depositing a conductor core layer over the barrier layer to fill the opening in the dielectric layer.

2. The method of manufacturing an integrated circuit as claimed in claim 1 wherein depositing the conformal atomic liner deposits a material selected from a group consisting of titanium, tantalum, tungsten, an alloy thereof, and a compound thereof.

3. The method of manufacturing an integrated circuit as claimed in claim 1 wherein depositing the conformal atomic liner deposits a material selected from a group consisting of titanium, tantalum, tungsten, an alloy thereof, and a compound thereof and the material includes impurities selected from a group consisting of nitrogen, silicon, and carbon.

4. The method of manufacturing an integrated circuit as claimed in claim 1 wherein depositing the conformal atomic liner deposits multiple atomic layer thicknesses of a material selected from a group consisting of titanium, tantalum, tungsten, an alloy thereof, and a compound thereof.

5. The method of manufacturing an integrated circuit as claimed in claim 1 including amorphizing the conformal atomic liner.

6. The method of manufacturing an integrated circuit as claimed in claim 1 wherein depositing the barrier layer deposits a material selected from a group consisting of titanium, tantalum, tungsten, an alloy thereof, and a compound thereof.

7. The method of manufacturing an integrated circuit as claimed in claim 1 wherein depositing the conformal atomic liner deposits an atomic layer thickness of material from 30 to 70 angstroms thick.

8. The method of manufacturing an integrated circuit as claimed in claim 1 wherein depositing the conformal atomic liner is performed using a process selected from the group consisting of atomic layer deposition, atomic layer chemical vapor deposition, and a combination thereof.

9. The method of manufacturing an integrated circuit as claimed in claim 1 including applying a plasma reduction process before depositing the conformal atomic layer deposition.

10. The method of manufacturing an integrated circuit as claimed in claim 1 wherein depositing the barrier layer is performed using a process selected from the group consisting of chemical-vapor deposition, self-ionized plasma deposition, and a combination thereof.

11. The method of manufacturing an integrated circuit as claimed in claim 1 including increasing the atomic layer thickness of the conformal atomic liner by a sputtering process.

12. The method of manufacturing an integrated circuit as claimed in claim 1 wherein depositing the conductor core deposits material selected from a group consisting of copper, gold, silver, a compound thereof, and a combination thereof.

13. The method of manufacturing an integrated circuit as claimed in claim 1 wherein depositing the dielectric layer deposit a material having a dielectric constant under 3.9.

14. The method of manufacturing an integrated circuit as claimed in claim 1 including depositing a seed layer on the barrier layer and depositing the seed layer deposits material selected from a group consisting of copper, gold, silver, a compound thereof, and a combination thereof.

* * * * *